United States Patent [19]
Zink et al.

[11] Patent Number: 6,118,709
[45] Date of Patent: Sep. 12, 2000

[54] EXTERNALLY CONTROLLED POWER ON RESET DEVICE FOR NON-VOLATILE MEMORY IN INTEGRATED CIRCUIT FORM

[75] Inventors: Sebastien Zink; David Naura, both of Aix En Provence, France

[73] Assignee: STMicroelectronics S.A., Gentilly, France

[21] Appl. No.: 09/121,466

[22] Filed: Jul. 23, 1998

[30] Foreign Application Priority Data

Jul. 24, 1997 [FR] France .................................. 97 09440

[51] Int. Cl.$^7$ ........................................... G11C 7/00
[52] U.S. Cl. ........................... 365/191; 365/226; 365/239
[58] Field of Search ........................... 365/191, 226, 365/239

[56] References Cited

U.S. PATENT DOCUMENTS

| | | | |
|---|---|---|---|
| 5,379,175 | 1/1995 | Masaki | 361/56 |
| 5,606,531 | 2/1997 | Moroni et al. | 365/191 |
| 5,646,902 | 7/1997 | Park | 365/226 |
| 5,706,242 | 1/1998 | Hirano et al. | 365/226 |
| 5,774,402 | 6/1998 | Lee | 365/191 |

FOREIGN PATENT DOCUMENTS

| | | | |
|---|---|---|---|
| 0 471 542 | 2/1992 | European Pat. Off. | G11C 29/00 |
| 2 180 967 | 4/1987 | United Kingdom | G06F 7/04 |
| 97/04575 | 2/1997 | WIPO | H04M 3/00 |

OTHER PUBLICATIONS

French Search Report from French Patent Application 97 09440, filed Jul. 24, 1997.

"Device For 'Safe–Guarding' An Electronic Sensing Based Supplemental Inflatable Restraint System" Research Disclosure, No. 339, Jul. 1, 1992, p. 532.

*Primary Examiner*—Richard Elms
*Assistant Examiner*—Juan T. Nguyen
*Attorney, Agent, or Firm*—Wolf, Greenfield & Sacks, P.C.; James H. Morris; Theodore E. Galanthay

[57] ABSTRACT

A device for the resetting of a memory circuit in integrated circuit form includes means to recognize a particular sequence on one or more external signals applied to the integrated circuit, different from the sequences of operational functioning of the integrated circuit.

29 Claims, 3 Drawing Sheets

EXTERNALLY CONTROLLED POWER ON RESET DEVICE FOR NON-VOLATILE MEMORY IN INTEGRATED CIRCUIT FORM

BACKGROUND OF THE INVENTION

1. Field of the Invention

The invention relates to an externally controlled power on reset device for a non-volatile memory in integrated circuit form.

2. Discussion of the Related Art

Memory circuits usually have reset circuitry that acts upon the detection of a decrease or a rise in the logic supply voltage Vcc of the integrated circuit.

This is the so-called POR or power-on-reset circuit whose mechanism is used to prevent any memory operation once the supply voltage decreases below a defined lower limit threshold or goes above a defined upper limit threshold. However, a decrease in supply voltage needs to be sufficiently lengthy (in the range of some microseconds) in order to be detected by the POR circuitry.

In an application system, the memory circuit is one of several that are managed by at least one microprocessor circuit or microcontroller circuit to implement an application program.

In this context, it may be useful for the microprocessor to enforce the resetting of the memory circuit. This may be the case when the microprocessor has detected an error in the instructions sent to the memory, this error being due to noise that prompts parasitic pulses on a control signal. This may be the case if the microprocessor has sent certain instructions to the memory circuit and then detected a fall in the supply voltage. It is then desirable that a microprocessor should be capable of stopping the performance of the instructions in the memory circuit. Indeed, the POR circuitry is slow to detect a variation and does not detect excessively rapid voltage decreases.

Furthermore, the POR circuitry is not very precise as regards detection thresholds. For example, for a lower limit threshold set at 3.7 volts, the circuitry will in practice be activated within an interval [3.5–3.9] volts as a function of the ambient temperature, variations in manufacturing method, etc.

The microprocessor for its part comprises very precise and fast detection means. It is therefore appropriate that the microprocessor which detects these variations while it sends instructions to be performed in the memory circuit should be capable of stopping the circuit so as to prevent any error of execution (in memory writing operations).

In particular, in GSM applications, it is very important to have a very precise detection threshold. This is offered by the microprocessor in an application of this kind but not by the POR circuitry of the memory circuit.

In all these cases, which are not exhaustive, there is a definite value in allowing the microprocessor to enforce the resetting of the memory circuit in order to protect it or release it. Furthermore, it may be necessary to enforce the resetting of the memory circuit during industrial testing.

In the prior art, to enforce the resetting of the memory circuit, it is necessary to activate the POR mechanism, namely to enforce a decrease that is sufficiently lengthy (some microseconds) in the logic supply voltage of the memory circuit. It is then necessary to separate the logic supply of the memory circuit from the logic supply of the other circuits of the application system so as not to affect these other circuits in the event of enforced resetting.

Furthermore, it has been seen that the POR circuitry requires a lengthy decrease in voltage which will substantially slow down the application program. In a GSM application in particular, the excessively slow response of the POR circuitry means that the advantages of precise detection by the microprocessor are lost. This problem is found also in the industrial testing of the memory circuit. Indeed the full importance of the testing duration, which has a direct effect on costs and delivery times, is known.

SUMMARY OF THE INVENTION

It is an object of the invention to resolve this technical problem of the resetting of an integrated circuit. An object of the invention is a resetting device capable of responding at high speed (within a few hundreds of nanoseconds) to an external activation command. Another object of the invention is a resetting device that works together with the POR device to provide very extensive protection to the integrated circuit.

One solution to this technical problem has been found in the invention in an internal device of the integrated circuit receiving one or more external signals applied to the integrated circuit, capable of recognizing a particular sequence, in said signals, that is different from the operational functioning sequences of the integrated circuit and producing, at output, a circuit for the internal resetting of the integrated circuit.

According to one embodiment of the invention, the device has a detector of a high voltage at an external signal input whose level in operational mode is zero or Vcc.

According to another embodiment of the invention, the device comprises a state machine that receives said signals at input and is configured to detect a particular sequence of logic states on these signals.

It is possible to combine the embodiments, thus providing several different external commands for the enforced resetting of the memory circuit.

The resetting signal delivered by the device of the invention will be preferably combined with the resetting signal delivered by the POR circuitry to activate the different resetting circuits.

BRIEF DESCRIPTION OF THE DRAWINGS

Other features and advantages of the invention are described in detail in the following description given by way of an illustration that in no way restricts the scope of the invention, made with reference to the appended drawings of which.

DETAILED DESCRIPTION

Figure 1:
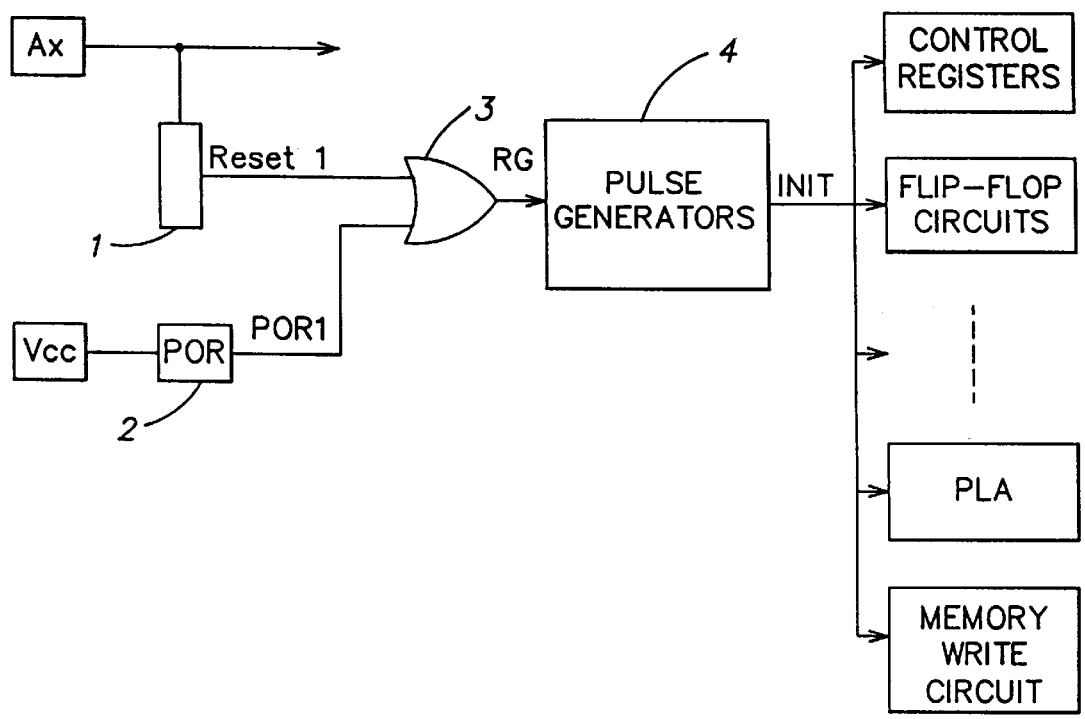
FIG. 1 shows a device according to a first embodiment of the invention.

FIG. 1 shows an internal device of a memory circuit capable of detecting a high voltage at an external signal input Ax, the operational level of which is zero or Vcc (Vcc being the logic supply of the integrated circuit).

The external input signal Ax used will typically be an address signal or a control signal like the package selection signal CS or the read or write activation signal.

The device includes a high voltage detector 1 that is connected at input to the external input signal Ax and produces, at output, an enforced resetting signal referenced Resetl.

In the example shown, the integrated circuit furthermore comprises a device 2 for detecting a fall or a rise in the logic supply Vcc applied to the circuit. This POR device produces, at its output, a corresponding reset signal referenced POR1.

In the example, the enforced resetting signal Resetl and the signal POR1 for resetting at a fall or a rise in the supply voltage Vcc are combined in an OR type logic gate 3 to produce a general resetting signal RG.

This general resetting signal RG is applied to the resetting circuitry 4 proper, which includes circuit for the generation of a resetting pulse INIT of minimum width that is applied as an input or the resetting of the different logic elements of the memory circuit, namely the control registers, lip-flops, PLA, and write circuitry.

Figure 2:
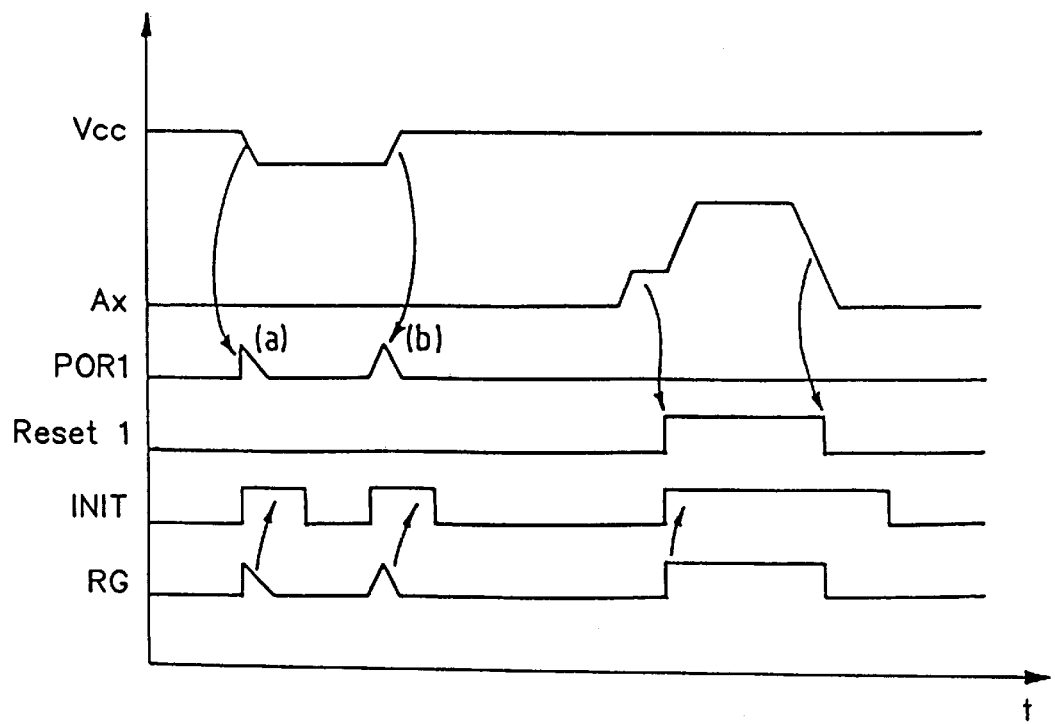
FIG. 2 shows a timing diagram associated with the different signals.

FIG. 2 shows a timing diagram corresponding to the different resetting signals.

The figure shows first of all the two pulses for the detection of a fall (a) and a rise (b) in the logic supply produced by the signal POR1. These two pulses are found in the general resetting signal RG as are two corresponding resetting pulses INIT with a minimum width.

The figure then shows a pulse for the detection of a high voltage on the external input signal Ax, produced by the high voltage detector 1 on the signal Reset1.

This pulse is seen again in the general resetting signal RG. It produces a corresponding pulse on the signal INIT (by means of the pulse generator 4).

Figure 3:
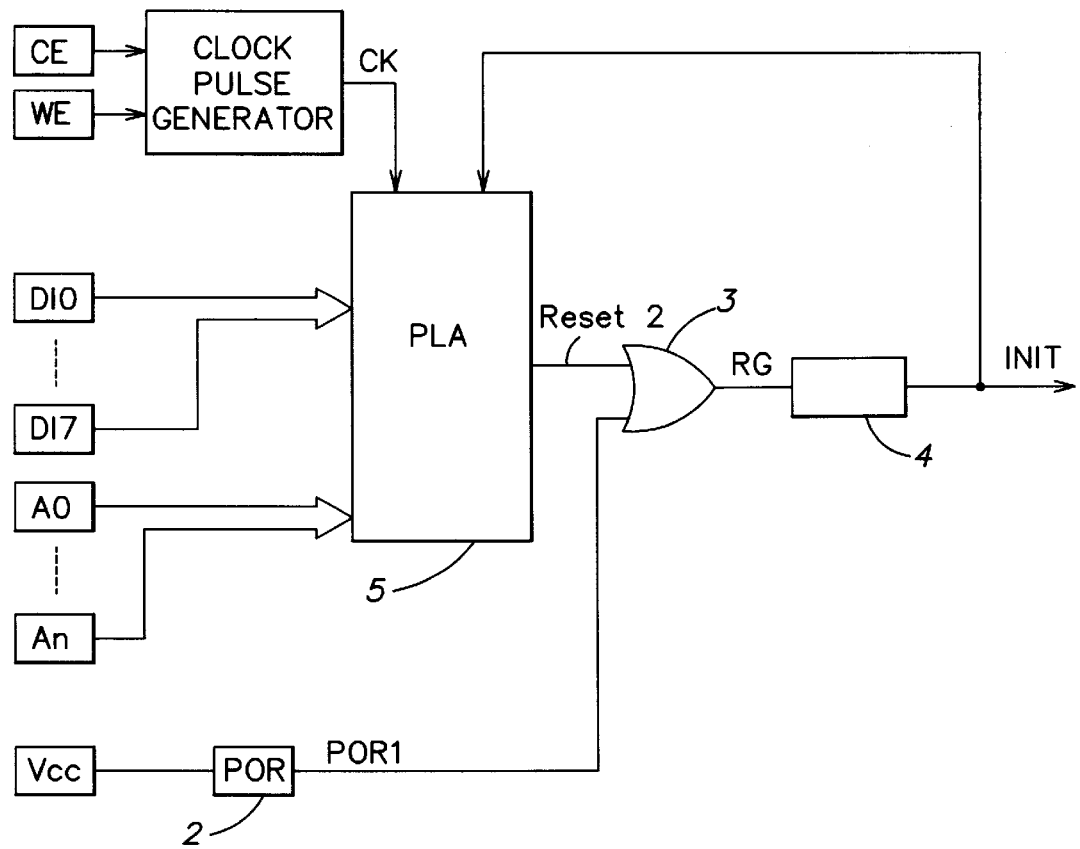
FIG. 3 shows a device according to another embodiment of the invention.

FIG. 3 shows another embodiment of the invention. Here, the embodiment uses the address signals A0–An and the data signals DI0–DI7 applied to the input of the integrated circuit to apply the external command for the enforced resetting of the memory circuit.

A state machine 5 is thus planned as a device for the detection of this external command.

At input, this machine receives the address and data signals referred to here above and a sequencing signal CK produced from either the pack selection signal CE or the write signal WE, the other one being held at zero.

This state machine which, in practice, will be a programmable logic array PLA is programmed to recognize a sequence of particular logic levels on said signals and produce an enforced resetting signal Reset2 at output.

Preferably, as in the example described here above with reference to FIG. 1, the signal Reset2 is combined in an OR type logic gate 3 with the signal POR1 produced by a device 2 for the detection of a fall/rise in the logic supply voltage Vcc applied to the integrated circuit (the elements common to FIGS. 1 and 2 bear the same references).

This particular sequence must correspond to a non-operational sequence of the memory circuit, namely one that does not activate any read/write command. Starting from the initial state, at each pulse on the sequencing signal CK, the state machine 5 decodes what is presented to it at its input to detect a first code <1>. If there is detection, it goes to the level of the second code <2> for the following sequence. If not it remains at the first code <1>.

If it decodes the second code <2>, it takes position at the third code <3>. Else it returns to the first code <1> and so on and so forth.

The external control sequence that may be chosen depends chiefly on the set of operational instructions of the integrated circuit.

In one example of a memory circuit comprising a write instruction in page mode, namely enabling the writing of several words (bytes) at different column addresses on one and the same row address, the sequence chosen is one that corresponds to the page mode, wherein the row addresses are changed. Since the changing of the row address is prohibited in page mode, the writing is not activated.

By using a sequence of this kind with specified data and a sequence of specified different addresses, an external resetting control sequence that is easy to implement is obtained.

Figure 4:
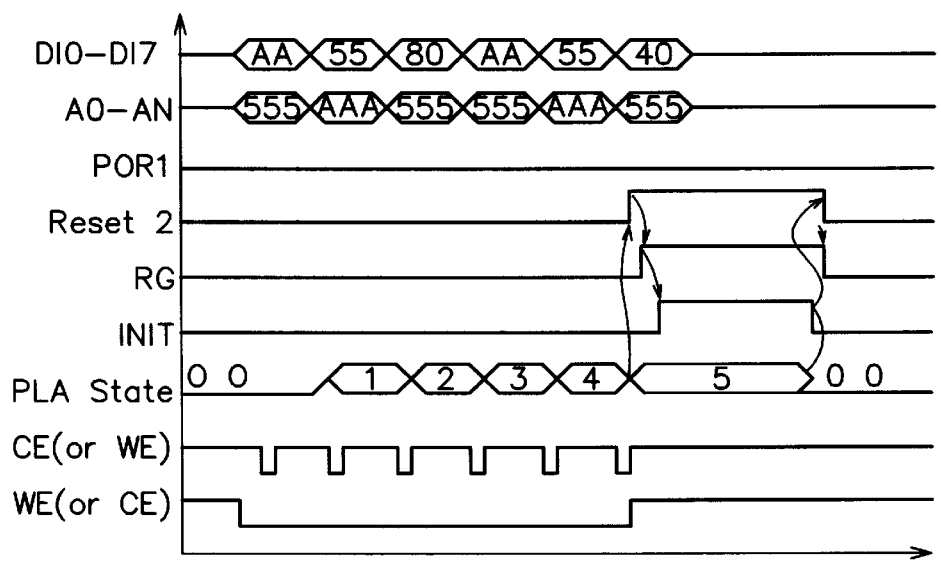
FIG. 4 shows a corresponding timing diagram.

An example of such a sequence is given in FIG. 4. The "hexadecimal" addresses 555 and AAA alternate successively with reference to the data elements AA, 55, 80 and 40 in a determined sequence.

The state machine 5 decodes the sequence and in the example, after the detection of the fifth code <5>, enforces a high transition at output on the enforced resetting signal Reset2. In practice, the address is decoded on the trailing edge of the signal (CE) and the data element is decoded on the leading edge.

The transition on the signal Reset2 is reproduced on the general reset signal. There follows a resetting pulse on the signal INIT which resets the different logic elements of the memory circuit, including the state machine 5 itself. The machine therefore gets repositioned on a first code <1> to be detected and makes the output signal Reset2 return to zero (low transition) and consequently makes the general resetting signal RG return to zero.

Figure 5:
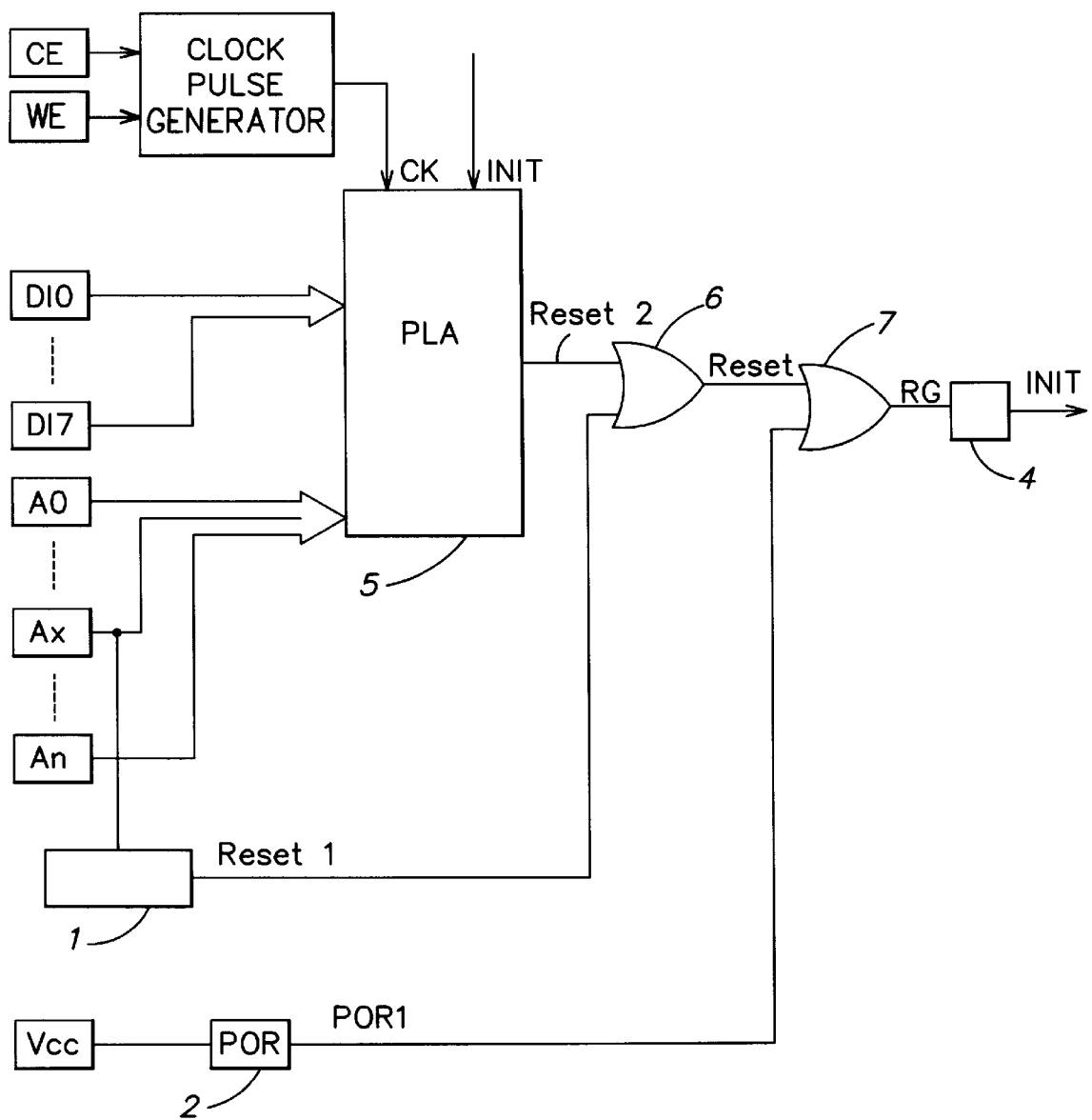
FIG. 5 shows an exemplary combination of the two preceding embodiments.

FIG. 5 shows a possible combination of the two embodiments of the invention that have been described.

The two signals Resetl, Reset2 are combined in an OR logic gate 6 to produce a general enforced resetting signal Reset which is itself combined with the signal PO1 in an OR logic gate 7 to produce the general resetting signal RG.

We thus have a memory circuit that enables an external resetting by different means 1, 5. This enables an adaptation to the application system for which the device is intended, as a function of the external means available.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device for resetting a memory circuit in integrated circuit form, to which there are applied external signals at an input to activate an operation of said memory circuit on the basis of operational sequences of said signals, wherein said device comprises means for detection of a particular sequence on at least one of said signals to produce, at output, an enforced resetting signal towards logic elements of the memory circuit and wherein said particular sequence corresponds to a non-operational sequence of the memory circuit.

2. A resetting device according to claim 1, wherein said detection means comprise a detector of high voltage at an external signal input, said detector of high voltage producing a first enforced reset signal.

3. A device for resetting a memory circuit in integrated circuit form, to which there are applied external signals at an input to activate an operation of said memory circuit on the basis of operational sequences of said signals, wherein said device comprises means for detection of a particular sequence on at least one of said signals to produce, at output, an enforced resetting signal towards logic elements of the memory circuit wherein said detection means comprise a state machine to recognize a particular sequence of logic levels on at least one external signal of the integrated circuit, this state machine producing a second enforced reset signal at its output.

4. A reset device according to claim 3, wherein the particular sequence comprises a page mode write sequence with at least one change of row address at each new data element.

5. A device for resetting a memory circuit in integrated circuit form, to which there are applied external signals at an input to activate an operation of said memory circuit on the basis of operational sequences of said signals, wherein said device comprises means for detection of a particular sequence on at least one of said signals to produce, at output, an enforced resetting signal towards logic elements of the memory circuit wherein said detection means comprise a detector of high voltage at an external signal input, said detector of high voltage producing a first enforced reset signal; and
   wherein the first enforced reset signal is combined with a reset signal delivered by a detector of a decrease/rise in a logic supply of the integrated circuit, by means of OR logic gates, to provide a general reset signal.

6. A device for resetting a memory circuit in integrated circuit form, to which there are applied external signals at an input to activate an operation of said memory circuit on the basis of operational sequences of said signals, wherein said device comprises means for detection of a particular sequence on at least one of said signals to produce, at output, an enforced resetting signal towards logic elements of the memory circuit wherein said detection means comprise a state machine to recognize a particular sequence of logic levels on at least one external signal of the integrated circuit, this state machine producing a second enforced reset signal at its output wherein the second enforced reset signal is combined with a reset signal delivered by a detector of a decrease/rise in a logic supply of the integrated circuit, by means of OR logic gates, to provide a general reset signal.

7. The device of claim 1, implemented in integrated circuit form with a memory circuit.

8. A system for resetting a memory circuit including logic elements, said system comprising:
   an input for receiving an external signal that initiates operation of said memory circuit on the basis of a predetermined operational sequence of said external signal; means coupled from said input for receiving and detecting said predetermined operational sequence; an output from said means for receiving and detecting and adapted, upon said detection, to produce an enforced resetting signal for coupling to and controlling the logic elements of said memory circuit, a power-on reset circuit including a detector of a change in a logic supply to provide a power-on reset signal, and means responsive to the occurrence of either of said enforced resetting signal and said power-on reset signal to provide a general reset signal.

9. A system according to claim 8 wherein said memory circuit is of integrated circuit type.

10. A system according to claim 9 wherein said integrated circuit has an internal device for receiving one or more external signals applied to the integrated circuit and capable of recognizing said predetermined operational sequence.

11. A system according to claim 10 wherein said means for receiving and detecting comprises a high voltage detector.

12. A system according to claim 11 wherein said high voltage detector produces a first enforced reset signal.

13. A system according to claim 12 wherein said power-on reset circuit comprises a detector of a fall or rise in a logic supply of the integrated circuit.

14. A system for resetting a memory circuit including logic elements, said system comprising:
   an input for receiving an external signal that initiates operation of said memory circuit on the basis of a predetermined operational sequence of said external signal; means coupled from said input for receiving and detecting said predetermined operational sequence; an output from said means for receiving and detecting and adapted, upon said detection, to produce an enforced resetting signal for coupling to and controlling the logic elements of said memory circuit wherein said memory circuit is of integrated circuit type;
   said integrated circuit has an internal device for receiving one or more external signals applied to the integrated circuit and capable of recognizing said predetermined operational sequence;
   said means for receiving and detecting comprises a high voltage detector;
   said high voltage detector produces a first enforced reset signal further including a power-on reset circuit;
   said power-on reset circuit comprises a detector of a fall or rise in the logic supply of the integrated circuit; and including OR logic gate means for receiving said first enforced reset signal and said power-on reset signal to provide a general reset signal.

15. A system according to claim 8 wherein said means for receiving and detecting, and said memory circuit are together implemented in integrated circuit form.

16. A system according to claim 8 wherein said means for receiving and detecting comprises a state machine.

17. A system for resetting a memory circuit including logic elements, said system comprising:
   an input for receiving an external signal that initiates operation of said memory circuit on the basis of a predetermined operational sequence of said external signal; means coupled from said input for receiving and detecting said predetermined operational sequence; an output from said means for receiving and detecting and adapted, upon said detection, to produce an enforced resetting signal for coupling to and controlling the logic elements of said memory circuit wherein said means for receiving and detecting comprises a state machine wherein said state machine receives, as said predetermined operational sequence, a sequence of logic levels.

18. A system according to claim 17 wherein said state machine produces a second enforced reset signal at said output.

19. A system according to claim 18 wherein the predetermined operational sequence comprises a page mode write sequence with at least one change of row address at each new data element.

20. A system according to claim 18 including a power-on reset circuit for providing a power-on reset signal.

21. A system according to claim 20 wherein said power-on reset circuit comprises a detector of a fall or rise in the logic supply of the integrated circuit.

22. A system resetting a memory circuit including logic elements, said system comprising:
   an input for receiving an external signal that initiates operation of said memory circuit on the basis of a predetermined operational sequence of said external signal; means coupled from said input for receiving and detecting said predetermined operational sequence; an output from said means for receiving and detecting and adapted, upon said detection, to produce an enforced resetting signal for coupling to and controlling the logic elements of said memory circuit wherein said means for receiving and detecting comprises a state machine;

said state machine produces a second enforced reset signal at said output;

wherein the particular sequence comprises a page mode write sequence with at least one change of row address at each new data element including a power-or reset circuit for providing a power-on reset signal; and wherein said power-on reset circuit comprises a detector of a fall or rise in the logic supply of the integrated circuit including OR logic gate means for receiving said second enforced reset signal and said power-on reset signal to provide a general reset signal.

23. A system according to claim 22 including a clock pulse generator coupled to said state machine.

24. A system according to claim 23 wherein said OR logic gate means includes two OR gates coupled in series, one receiving the enforced reset signal and the other receiving the power-on reset signal.

25. A method for resetting a memory circuit that includes logic elements, said method comprising the steps of:

provided an external signal that initiates operation of the memory circuit on the basis of a predetermined operational sequence of said external signal;

receiving and detecting said predetermined operational sequence; and outputting, upon said detection, an enforced resetting signal for coupling to and controlling the logic elements of said memory circuit;

wherein said step of receiving and detecting comprises providing a state machine;

and wherein the step of providing a state machine includes the machine receiving, as said predetermined operational sequence, a sequence of logic levels.

26. The method of claim 25 wherein the step of receiving and detecting includes detecting a high voltage to produce a first enforced reset signal.

27. The method of claim 26 further providing a power on reset signal for controlling said memory circuit.

28. The method of claim 25 wherein the sequence of logic levels corresponds to a non-operational sequence of the memory circuit.

29. A method for resetting a memory circuit that includes logic elements, said method comprising the steps of:

providing an external signal that initiates operation of the memory circuit on the basis of a predetermined operational sequence of said external signal;

receiving and detecting said predetermined operational sequence;

outputting, upon said detection, an enforced resetting signal for coupling to and controlling the logic elements of said memory circuit;

outputting a power-on reset signal for controlling the memory circuit, and generating a general reset signal if either the power-on reset or the enforced reset signal is detected.

* * * * *